United States Patent
Chudzik et al.

(10) Patent No.: US 7,622,341 B2
(45) Date of Patent: Nov. 24, 2009

(54) SIGE CHANNEL EPITAXIAL DEVELOPMENT FOR HIGH-K PFET MANUFACTURABILITY

(75) Inventors: Michael P. Chudzik, Danbury, CT (US); Dominic J. Schepis, Wappingers Falls, NY (US); Linda Black, Wappingers Falls, NY (US)

(73) Assignees: International Business Machines Corporation, Armonk, NY (US); Advanced Micro Device, Inc., Austin, TX (US)

( * ) Notice: Subject to any disclaimer, the term of this patent is extended or adjusted under 35 U.S.C. 154(b) by 112 days.

(21) Appl. No.: 12/014,815

(22) Filed: Jan. 16, 2008

(65) Prior Publication Data
US 2009/0181507 A1 Jul. 16, 2009

(51) Int. Cl.
*H01L 21/00* (2006.01)
(52) U.S. Cl. ............... 438/199; 438/283; 438/285; 438/300; 438/301; 257/E21.632; 257/E21.637; 257/E21.639; 257/E21.642; 257/E21.703; 257/E27.046; 257/E27.112; 257/E29.086
(58) Field of Classification Search ............... 438/199, 438/283, 300, 301; 257/E21.632, 637, 639, 257/642, 703, E27.046, 112, E29.286
See application file for complete search history.

(56) References Cited
U.S. PATENT DOCUMENTS
5,767,549 A * 6/1998 Chen et al. ............... 257/347

| | | | | |
|---|---|---|---|---|
| 6,653,698 B2 * | 11/2003 | Lee et al. | | 257/407 |
| 7,018,883 B2 * | 3/2006 | Wang et al. | | 438/199 |
| 7,384,851 B2 * | 6/2008 | Ieong et al. | | 438/283 |
| 7,402,885 B2 * | 7/2008 | Sudo | | 257/509 |
| 2005/0104131 A1 * | 5/2005 | Chidambarrao et al. | | 257/369 |
| 2005/0280104 A1 | 12/2005 | Li | | |
| 2006/0068575 A1 * | 3/2006 | Gluschenkov et al. | | 438/585 |
| 2007/0138563 A1 | 6/2007 | Callegari et al. | | |
| 2007/0141797 A1 | 6/2007 | Li | | |
| 2007/0254464 A1 | 11/2007 | Greene et al. | | |
| 2009/0152637 A1 * | 6/2009 | Carter et al. | | 257/369 |

* cited by examiner

*Primary Examiner*—Michael S Lebentritt
(74) *Attorney, Agent, or Firm*—Gibb I.P. Law Firm, LLC; Yuanmin Cai

(57) ABSTRACT

A method for growing an epitaxial layer patterns a mask over a substrate. The mask protects first areas (N-type areas) of the substrate where N-type field effect transistors (NFETs) are to be formed and exposes second areas (P-type areas) of the substrate where P-type field effect transistors (PFETs) are to be formed. Using the mask, the method can then epitaxially grow the Silicon Germanium layer only on the P-type areas. The mask is then removed and shallow trench isolation (STI) trenches are patterned (using a different mask) in the N-type areas and in the P-type areas. This STI patterning process positions the STI trenches so as to remove edges of the epitaxial layer. The trenches are then filled with an isolation material. Finally, the NFETs are formed to have first metal gates and the PFETs are formed to have second metal gates that are different than the first metal gates. The first metal gates have a different work function than the second metal gates.

21 Claims, 2 Drawing Sheets

SIGE CHANNEL EPITAXIAL DEVELOPMENT FOR HIGH-K PFET MANUFACTURABILITY

FIELD OF THE INVENTION

Embodiments herein generally relate to transistor structures, and more particularly to a method that epitaxially grows a doped layer and uses the position of isolation trenches to trim the edges (that can have inconsistent thicknesses) of the doped layer to ensure a uniform epitaxial layer, which increases performance and yield.

BACKGROUND

As explained in U.S. Patent Publication 2007/0138563 (incorporated herein by reference) in complementary metal oxide semiconductor (CMOS) devices, polysilicon used to be the standard gate material. One advantage of using polysilicon gates is that they can sustain high temperatures. However, there are some problems associated with using a polysilicon gates and, therefore, metal gates are becoming more popular.

Further, as explained in U.S. Patent Publications 2005/0280104 and 2007/0141797 (incorporated herein by reference) the gate dielectric for metal oxide semiconductor field of fact transistor (MOSFET) devices has in the past typically comprised silicon dioxide, which has a dielectric constant of about 3.9. However, as devices are scaled down in size, using silicon dioxide as a gate dielectric material becomes a problem because of gate leakage current, which can degrade device performance. Therefore, there is a trend in the industry towards the development of the use of high dielectric constant (k) materials for use as the gate dielectric material of MOSFET devices. The term "high k material" as used herein refers to a dielectric material having a dielectric constant of about 4.0 or greater.

In dual metal gate transistor devices, metals of different work functions are used for the different types of transistors. Sometimes, an epitaxial layer can help maintain threshold voltage of transistors that utilize metal gates. However, epitaxially grown layers can have thickness inconsistencies, which results in inconsistent performance of the transistors.

SUMMARY

Embodiments herein comprise a method for growing an epitaxial layer (e.g., Silicon Germanium layer) that patterns a mask over a substrate (e.g., Silicon Germanium substrate). The mask protects first areas (N-type areas) of the Silicon substrate where N-type field effect transistors (NFETs) are to be formed and exposes second areas (P-type areas) of the Silicon substrate where P-type field effect transistors (PFETs) are to be formed. For purposes herein N-type areas mean NFET device areas when you say (N-type areas); however, this is not to be confused with N-type silicon where the silicon substrate is doped with N-dopants to cause the silicon to be N-type. Using the mask, the method can then epitaxially grow the Silicon Germanium layer only on the P-type areas. The mask is then removed and shallow trench isolation (STI) trenches are patterned (using a different mask) in the N-type areas and in the P-type areas. This STI patterning process positions the STI trenches so as to remove edges of the Silicon Germanium epitaxial layer. The trenches are then filled with an isolation material. Finally, the NFETs are formed to have first metal gates and the PFETs are formed to have second metal gates that are different than the first metal gates. The first metal gates have a different work function than the second metal gates. With the embodiments herein, the same metal material can be used for the NFET and PFET gates. Further, the silicon germanium epitaxial layer can cause a threshold voltage shift in the PFETs even if the same metal is used for both the NFET and PFET.

One feature of embodiments herein is that the edges of the Silicon Germanium layer that are removed when the STI trenches are formed have inconsistent thicknesses. Thus, after the patterning removes these edges, the Silicon Germanium layer comprises a consistent thickness between the trenches. For purposes herein, the "edges" of the Silicon Germanium layer comprise boundaries between where the Silicon Germanium layer is present and the Silicon Germanium layer is absent on the Silicon substrate. The Silicon Germanium layer alters a work function of the second metal gates.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF EMBODIMENTS OF THE INVENTION

Figure 1:
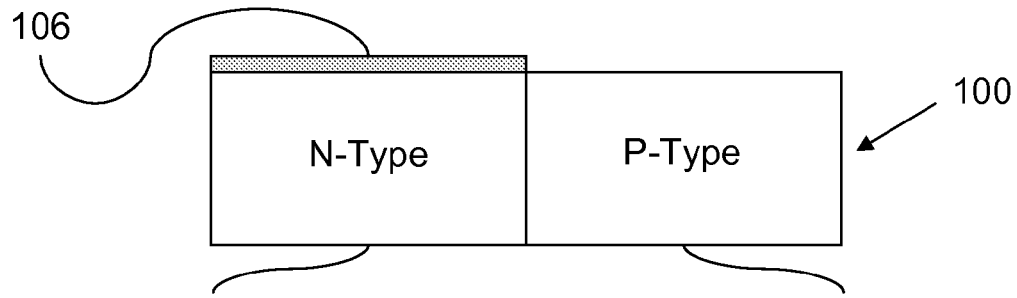
FIG. 1 is a schematic cross-sectional diagram of an integrated circuit structure according to embodiments herein.

The present invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

As mentioned above, in dual metal gate transistor devices, metals of different work functions are used for the different types of transistors. Sometimes, an epitaxial layer can help maintain threshold voltage of transistors that utilize metal gates. However, epitaxially grown layers can have thickness inconsistencies, which results in inconsistent performance of the transistors. Metal gate materials having a band-edge work function are attractive because of their high performance characteristics. The work function of metals can be varied according to the manufacturing process temperature. Many materials that exhibit band-edge work functions at a low temperature (e.g., less than about 900° C.) exhibit near-midgap work functions after a high temperature source/drain activation anneal (e.g., of greater than about 900° C.).

To enable high performance CMOS technologies such as high-k/metal gate solutions, a band-edge metal is advantageous to maximize performance and allow threshold voltages appropriate for low voltage, low power technologies. Although many band-edge metals (e.g., Nickle Silicide, Titanium Aluminum Nitride, Tantalum Silicon Nitride, etc.) can be used for NFET and PFET devices, many of these metals undergo shifts in threshold voltage (Vt) with further thermal cycles. However, the use of a thin (3-30 nm, for example) doped (e.g., SiGe) (Germanium percentage of 10-40%, for example) epitaxial layer grown on top of the single crystal silicon wafer substrate can enable a shift from a mid-gap work function to a band-edge work function for certain PFET metal gate candidates. This is useful for a dual metal gate CMOS structure. The "doped" used above indicates that a p-type dopant is incorporated into the epitaxial silicon germanium film. In practice, we have used both intrinsic (undoped) and boron doped films for this application and both are very useful based on electrical results.

However, one issue with growing an epitaxial layer on wafers patterned with shallow trench isolation (STI) regions is that the morphology (shape at the edges) at the STI edge can change the epitaxial growth locally leading to non-uniform film thickness. This non-uniformity causes a major change in threshold voltage, which substantially reduces device performance and, subsequently, yield. One solution is to grow a blanket doped epitaxial film on a wafer, and then remove the epitaxial film selectively from the NFET regions by etching. One drawback of removing the doped epitaxial layer is that it can result in damage to or recessing of the silicon substrate underneath the doped epitaxial film, thus damaging the NFET device.

In view of the foregoing, the present embodiments address these issues by selectively growing a doped epitaxial layer only in the PFET regions. The subsequent process of forming the STI isolation trenches removes the edges of the doped epitaxial (where the film may have a non-uniform thickness).

Figure 3:
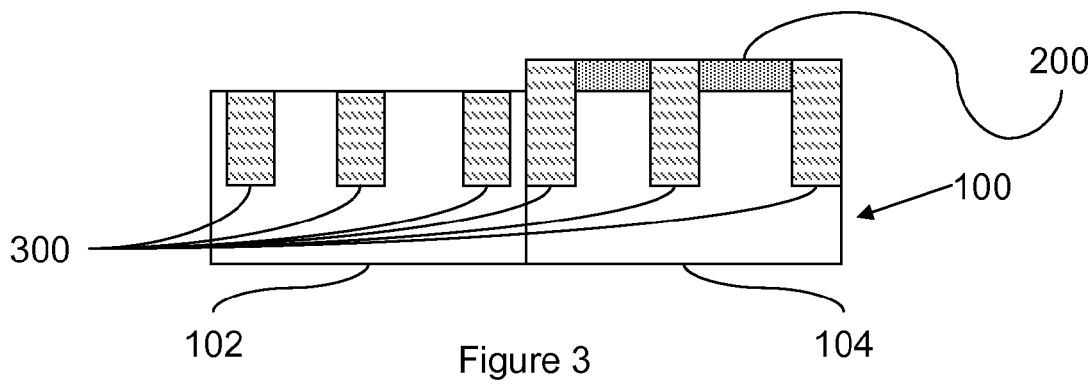
FIG. 3 is a schematic cross-sectional diagram of an integrated circuit structure according to embodiments herein.
Figure 4:
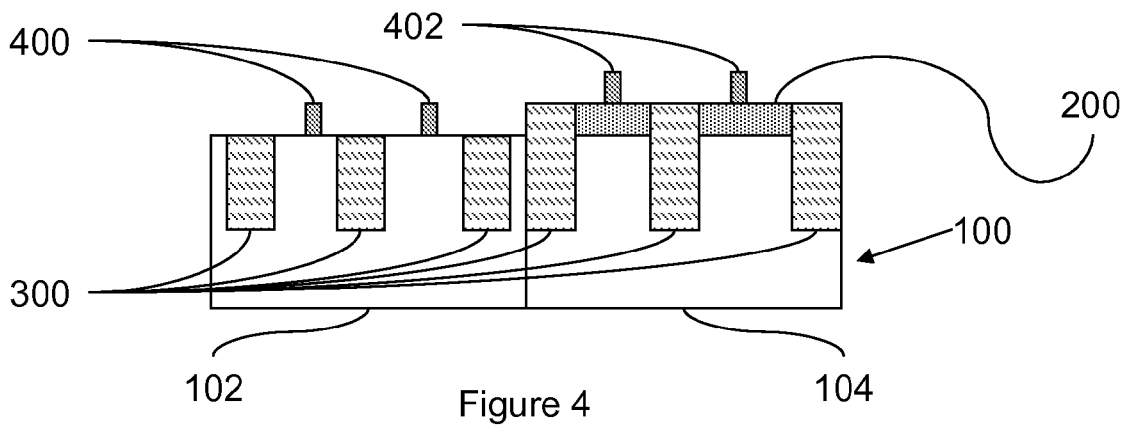
FIG. 4 is a schematic cross-sectional diagram of an integrated circuit structure according to embodiments herein.
Figure 5:
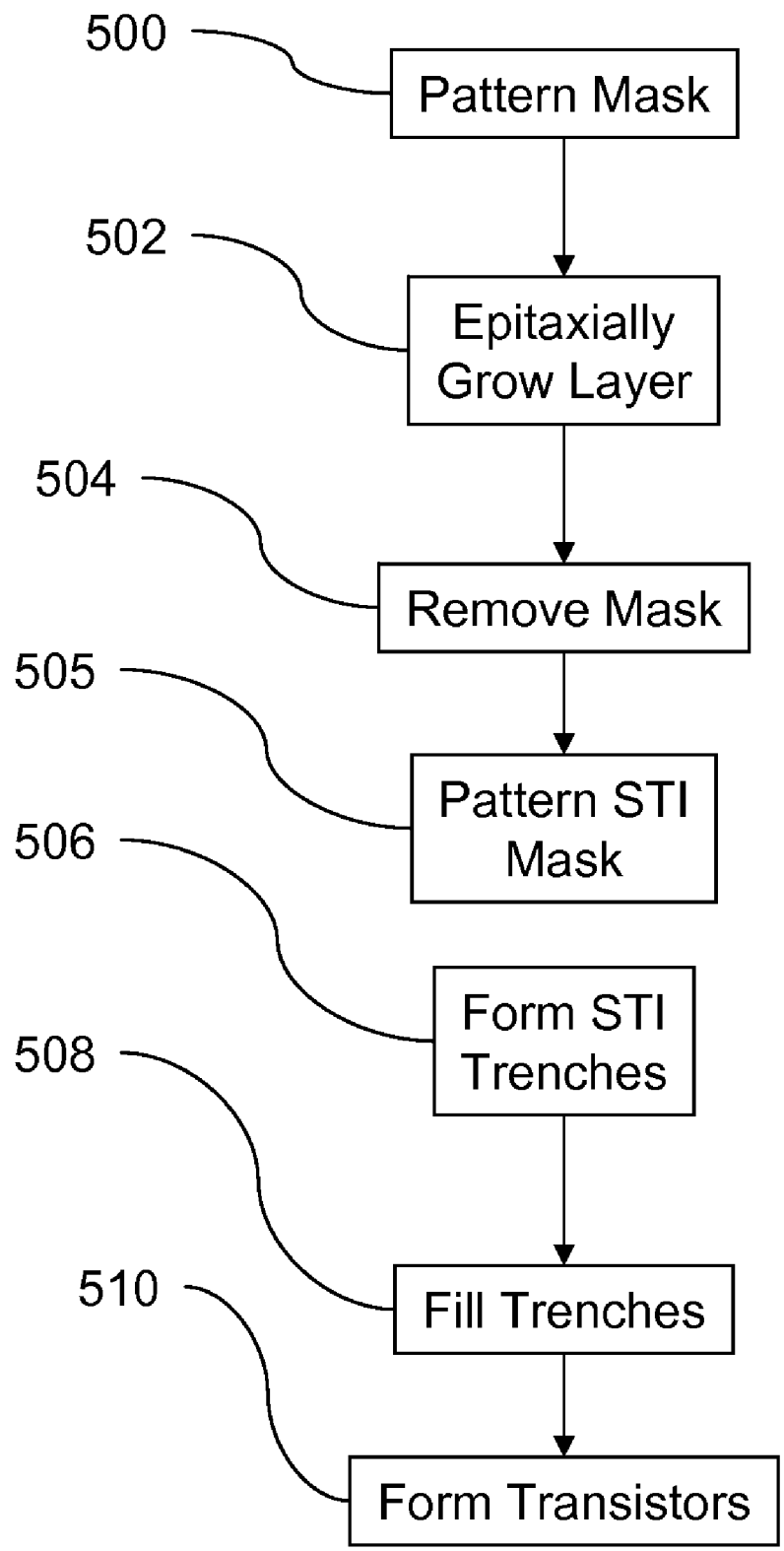
FIG. 5 is a flowchart illustrating a method embodiment herein.

More specifically, as shown schematically in cross-section in FIGS. 1-4 and in flowchart form in FIG. 5, embodiments herein comprise a method for growing an epitaxial layer (e.g., Silicon Germanium layer) that patterns a mask 106 over a substrate 100 (e.g., Silicon Germanium substrate) in item 500. A silicon substrate can be used as one embodiment. A silicon germanium substrate could be a secondary embodiment, but the silicon germanium epitaxial layer on a silicon substrate is the prime embodiment As shown in FIG. 1, the mask 106 protects first areas 102 (N-type areas) of the Silicon substrate 100 where N-type field effect transistors 400 (NFETs) are to be formed and exposes second areas 104 (P-type areas) of the Silicon substrate 100 where P-type field effect transistors 402 (PFETs) are to be formed.

P-type doping uses a trivalent atom (typically from group IIIA of the periodic table, such as Boron or Aluminum. Thus, Boron is an exemplary dopant for the PMOS. N-type doping is found in group 15 of the periodic table (e.g., Phosphorus (P), Arsenic (As), or Antimony (Sb)). Thus, Phosphorous and Arsenic are exemplary dopants for the NMOS.

Figure 2:
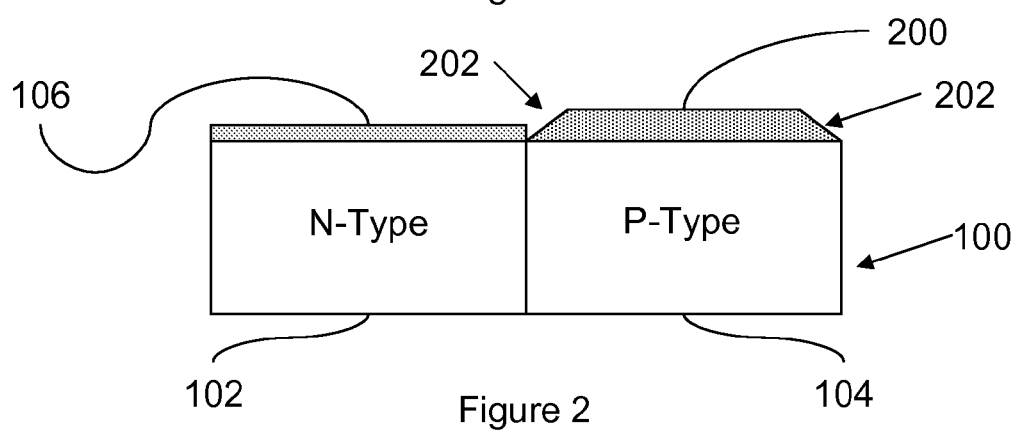
FIG. 2 is a schematic cross-sectional diagram of an integrated circuit structure according to embodiments herein.

As shown in item 502 and FIG. 2, using the mask 106, the method then epitaxially grows the Silicon Germanium layer 200 only on the P-type areas 104. For purposes herein, the "edges" 202 of the Silicon Germanium layer 200 comprise boundaries between where the Silicon Germanium layer 200 is present and the Silicon Germanium layer 200 is absent on the Silicon substrate 100.

As mentioned above, one problem is that the epitaxially grown doped layer tends to have a rounded-off profile at the edge of the silicon islands. Alternative growth conditions can produce a flatter profile, but such processing can produce facets at the silicon-STI boundaries. These changes in morphology at these boundaries cause severe changes in the device threshold voltage due to thickness and/or strain at these borders. Thus, the edges of the Silicon Germanium layer 200 can have inconsistent thicknesses. The Silicon Germanium layer 200 alters the work function of the second metal gates and, therefore, this non-uniformity at the edges 202 can cause a major change in threshold voltage, which can negatively affect performance and yield.

As shown in FIG. 3, the mask 106 is then removed (item 504), an STI mask is patterned (505) and shallow trench isolation (STI) trenches are patterned (item 506) using the STI mask and filled with an isolation material (item 508). As shown in FIG. 3, the STI regions 300 are in both the N-type areas 102 and in the P-type areas 104. This STI patterning process 506 positions the STI trenches so as to remove edges 202 of the Silicon Germanium layer 200.

Finally, as shown in FIG. 4 and item 510, the NFETs 400 are formed to have first metal gates and the PFETs 402 are formed to have second metal gates that are different than the first metal gates. The first metal gates have a different work function than the second metal gates. With the embodiments herein, the same metal material can be used for the NFET and PFET gates. Further, the silicon germanium epitaxial layer can cause a threshold voltage shift in the PFETs even if the same metal is used for both the NFET and PFET. The transistors can be of any type including, horizontal, vertical, three-dimensional (e.g., fin-type), etc. Note that FIGS. 1-4 are not drawn to scale and while the drawings may show a height difference between the N-type and P-type regions, any height difference would be insignificant as the features in the drawings are exaggerated to allow such features to be more easily drawn. Alternately, after patterning the first mask, the exposed substrate can be thinned by thermal oxidation or etching prior to the epitaxial layer growth. The thinning of the substrate can be made to match the thickness of the epitaxial layer so that the final structure can be planar. This recess is not usually required for films of thickness less than or equal to 20 nm, as would be understood by one skilled in the art.

The details of the various foregoing processes including mask formation and patterning, epitaxial growth, STI region formation, and transistor formation are well known to those ordinarily skilled in the art and the details of such processes are not described herein so as to focus the reader on the salient aspects of the invention. For example, U.S. Patent Publication 2007/0254464 (incorporated herein by reference) discusses many of the details of such processes.

Thus, one feature of embodiments herein is that the edges 202 of the Silicon Germanium layer 200 that are removed when the STI trenches are formed in item 506 can have inconsistent thicknesses. Thus, after the patterning 506 removes these edges 202, the Silicon Germanium layer 200 comprises a consistent thickness between the trenches, as shown in FIGS. 3 and 4.

Therefore, the embodiments herein make use of an epitaxially grown doped layer on large areas of silicon where the PFETS will be present. This larger area is grown such that the active regions are contained within the boundaries of the larger epitaxial layer growth regions. By patterning these regions during the STI process, the rounded edges of the epitaxial layer are removed.

While the invention has been described in terms of preferred embodiments, those skilled in the art will recognize that the invention can be practiced with modification within the spirit and scope of the appended claims.

What is claimed is:

1. A method comprising:
   patterning a mask over a substrate such that said mask protects first areas of said substrate where first-type field effect transistors are to be formed and exposes second areas of said substrate where second-type field effect transistors are to be formed;
   epitaxially growing a layer on said second areas;
   removing said mask;
   patterning shallow trench isolation (STI) trenches in said first areas and said second areas, wherein said patterning positions said trenches so as to remove edges of said layer;
   filling said trenches with an isolation material; and
   forming said first-type field effect transistors to have first metal gates and said second-type field effect transistors to have second metal gates different than said first metal gates.

2. The method according to claim 1, all the features of which are incorporated herein by reference, wherein said edges of said layer have inconsistent thicknesses.

3. The method according to claim 1, all the features of which are incorporated herein by reference, wherein after said patterning removes said edges, said layer comprises a consistent thickness between said trenches.

4. The method according to claim 1, all the features of which are incorporated herein by reference, wherein said edges of said layer comprise boundaries between where said layer is present and said layer is absent on said substrate.

5. The method according to claim 1, all the features of which are incorporated herein by reference, wherein said layer alters a work function of said second metal gates.

6. The method according to claim 1, all the features of which are incorporated herein by reference, wherein said first metal gates have a different work function than said second metal gates.

7. The method according to claim 1, all the features of which are incorporated herein by reference, wherein said substrate comprises a single crystal silicon wafer.

8. A method comprising:
   patterning a mask over a substrate such that said mask protects N-type areas of said substrate where N-type field effect transistors (NFETs) are to be formed and exposes P-type areas of said substrate where P-type field effect transistors (PFETs) are to be formed;
   epitaxially growing a layer on said P-type areas;
   removing said mask;
   patterning shallow trench isolation (STI) trenches in said N-type areas and said P-type areas, wherein said patterning positions said trenches so as to remove edges of said layer;
   filling said trenches with an isolation material; and
   forming said NFETs to have first metal gates and said PFETs to have second metal gates different than said first metal gates.

9. The method according to claim 8, all the features of which are incorporated herein by reference, wherein said edges of said layer have inconsistent thicknesses.

10. The method according to claim 8, all the features of which are incorporated herein by reference, wherein after said patterning removes said edges, said layer comprises a consistent thickness between said trenches.

11. The method according to claim 8, all the features of which are incorporated herein by reference, wherein said edges of said layer comprise boundaries between where said layer is present and said layer is absent on said substrate.

12. The method according to claim 8, all the features of which are incorporated herein by reference, wherein said layer alters a work function of said second metal gates.

13. The method according to claim 8, all the features of which are incorporated herein by reference, wherein said first metal gates have a different work function than said second metal gates.

14. The method according to claim 8, all the features of which are incorporated herein by reference, wherein said substrate comprises a single crystal silicon wafer.

15. A method comprising:
   patterning a mask over a Silicon Germanium substrate such that said mask protects N-type areas of said Silicon Germanium substrate where N-type field effect transistors (NFETs) are to be formed and exposes P-type areas of said Silicon Germanium substrate where P-type field effect transistors (PFETs) are to be formed;
   epitaxially growing a Silicon Germanium layer on said P-type areas;
   removing said mask;
   patterning shallow trench isolation (STI) trenches in said N-type areas and said P-type areas, wherein said patterning positions said trenches so as to remove edges of said Silicon Germanium layer;
   filling said trenches with an isolation material; and
   forming said NFETs to have first metal gates and said PFETs to have second metal gates different than said first metal gates.

16. The method according to claim 15, all the features of which are incorporated herein by reference, wherein said edges of said Silicon Germanium layer have inconsistent thicknesses.

17. The method according to claim 15, all the features of which are incorporated herein by reference, wherein after said patterning removes said edges, said Silicon Germanium layer comprises a consistent thickness between said trenches.

18. The method according to claim 15, all the features of which are incorporated herein by reference, wherein said edges of said Silicon Germanium layer comprise boundaries between where said Silicon Germanium layer is present and said Silicon Germanium layer is absent on said Silicon Germanium substrate.

19. The method according to claim 15, all the features of which are incorporated herein by reference, wherein said Silicon Germanium layer alters a work function of said second metal gates.

20. The method according to claim 15, all the features of which are incorporated herein by reference, wherein said first metal gates have a different work function than said second metal gates.

21. The method according to claim 15, all the features of which are incorporated herein by reference, wherein said substrate comprises a single crystal silicon wafer.

* * * * *